United States Patent [19]
Tocher et al.

[11] Patent Number: 5,651,495
[45] Date of Patent: Jul. 29, 1997

[54] THERMOELECTRIC COOLER ASSISTED SOLDERING

[75] Inventors: John L. Tocher, Hawthorne; Jacques F. Linder, Palos Verdes, both of Calif.

[73] Assignee: Hughes Aircraft Company, Los Angeles, Calif.

[21] Appl. No.: 165,874

[22] Filed: Dec. 14, 1993

[51] Int. Cl.⁶ .................. H01L 21/58; B23K 1/00
[52] U.S. Cl. .................. 228/123.1; 228/222; 219/85.22
[58] Field of Search .................. 228/123.1, 222; 437/902; 257/712; 219/85.22

[56] References Cited

U.S. PATENT DOCUMENTS

| | | | |
|---|---|---|---|
| 3,693,239 | 9/1972 | Dix | 228/180.1 |
| 4,389,557 | 6/1983 | Devenyi et al. | 228/222 |
| 4,832,251 | 5/1989 | Hawrylo | 228/105 |
| 4,944,569 | 7/1990 | Boudreau et al. | 257/712 X |
| 5,032,897 | 7/1991 | Mansuria et al. | 257/712 X |
| 5,099,487 | 3/1992 | Rickey et al. | 257/712 X |
| 5,229,327 | 7/1993 | Farnworth | 437/902 X |

*Primary Examiner*—Kenneth J. Ramsey
*Attorney, Agent, or Firm*—M. E. Lachman; M. W. Sales; W. K. Denson-Low

[57] ABSTRACT

An improved method for soldering a thermoelectric cooler between an electronic device and a heatsink. Thermoelectric coolers are assembled by soldering parts together using a first solder. The bottom surface of the thermoelectric cooler is first soldered to the heatsink using a second solder and then the top surface is soldered to the electronic device using a third solder preferably having the same melting point as the second solder, or having approximately the same melting point as the second solder. Reverse powering of the thermoelectric cooler assists the soldering of the top surface to the electronic device by heating the top surface to a temperature sufficient to melt the third solder while cooling the bottom surface of the thermoelectric cooler to a temperature lower than the melting point of the second solder. Since the second solder has a melting point chosen to be lower than the melting point of the first solder used to assemble the cooler and the third solder has preferably the same, or approximately the same melting point as the second solder, rather than a much lower melting point, the assembled electronic device may be operated at a higher temperature and tested at a higher thermal cycle.

9 Claims, 1 Drawing Sheet

THERMOELECTRIC COOLER ASSISTED SOLDERING

BACKGROUND OF THE INVENTION

1. Field of the Invention

The present invention relates to an improved method for soldering a thermoelectric cooler between an electronic device and a heatsink to permit higher operating temperature of the assembly.

2. Description of Related Art

Thermoelectric coolers are used in the electronics industry to cool electronics devices. Thermoelectric coolers are assembled by soldering parts together using a first solder. Typically, the cooler is soldered to a heatsink and the electronic device is soldered to the cooler. Unless elaborate tooling is used, this is a two-step process. First, the thermoelectric cooler is soldered to the substrate or heatsink with a second solder which melts at a lower temperature than the melting temperature of the first solder used to assemble the cooler, which is about 138° C. In one prior art approach, the second solder melts at 117° C. The electronic device is then soldered to the thermoelectric cooler. To avoid having the thermoelectric cooler become detached from the heatsink while it is being soldered to the electronic device, a third solder is used having a melting point lower than the second solder, for example, about 93° C. The operating and thermal cycle temperatures of the completed assembly are thus limited to below the melting temperature of the solder with the lowest liquidus. The use of the third solder having a melting point of 93° C. becomes the limiting factor for the operating and thermal cycle temperatures of the assembled device.

Thus, a need exists to provide an improved method for soldering a thermoelectric cooler between an electronic device and a heatsink that avoids or minimizes the above mentioned disadvantages.

SUMMARY OF THE INVENTION

In accordance with the invention, an improved method is provided for soldering a thermoelectric cooler between an electronic device and a heatsink. Thermoelectric coolers are assembled by soldering parts together using a first solder having a first melting point. The method comprises:

(a) selecting a second solder having a second melting point chosen to be lower than the first melting point of the first solder;

(b) soldering the bottom surface of the thermoelectric cooler to the heatsink using the second solder;

(c) soldering the top surface of the thermoelectric cooler to the electronic device using a third solder having a third melting point; and (d) powering the thermoelectric cooler in reverse to assist the soldering of the top surface to the electronic device by heating the top surface to a temperature sufficient to melt the third solder while cooling the bottom surface to a temperature lower than the melting point of the second solder.

For exemplary purposes only, the first solder, used to assemble the thermoelectric cooler, has a melting point of about 138° C. and the second solder has a melting point of about 117° C. The third solder has the same or approximately the same melting point as the second solder. The thermoelectric cooler heats the top surface to a temperature of about 125° C. while cooling the bottom surface to a temperature less than or equal to 100° C., thereby permitting the second solder to be employed sequentially in the two solder operations.

Since the second solder has a melting point chosen to be lower than the melting point of the first solder used to assemble the cooler, and the third solder has the same or nearly the same melting point as the second solder, rather than a lower melting point, the assembled electronic device may be operated at a higher temperature and tested at a higher thermal cycle than prior art approaches would permit. This results in (a) higher thermal cycling temperature and thus less time needed for thermal cycling and burn-in of the assembled electronic device, (b) higher operating temperature increasing the performance envelope during system test, (c) the use of higher temperature solders that are less prone to creep thus enhancing long-term reliability of the electronic device, (d) less complex assembly tooling, and (e) lower parts count.

DESCRIPTION OF THE PREFERRED EMBODIMENTS

Thermoelectric coolers of the prior art are soldered together with an alloy or solder melting at 138° C. To solder such a cooler to a heatsink, a solder having a lower melting point is required. The alloy or solder recommended in prior art for this purpose is an indium solder melting at 117° C. The thermoelectric cooler is soldered inside a gold plated metal package in a first solder operation, with 117° C. solder. The maximum temperature the cooler is expected to reach then is 125° C. An electronic device such as a silicon charge-coupled chip previously mounted onto a beryllia substrate (with gold plating), will be soldered on to the thermoelectric cooler in a second soldering operation. Normally, in order not to re-melt the first solder joint (117° C.), the solder utilized to mount the chip/substrate has to be an alloy with a lower melting point, such as a solder with a melting point of 93° C. The low melting point affects the burn-in of the assembled device. It cannot be burned in at a temperature above 85° C. At this low temperature, a burn-in would last several months.

In accordance with the present invention, the thermoelectric cooler is used as a heater to assist the soldering process by heating its top, normally cold surface, to 120° C. to 125° C. and melting the 117° C. solder while its bottom surface remains at 100° C. or less. Thus, the 117° C. solder can be used on both surfaces of the cooler, allowing the electronic device to be burned in at 105° C. to 110° C.

The present invention comprises an improved method for soldering a thermoelectric cooler between an electronic device and a heatsink. Thermoelectric coolers are assembled by soldering parts together using a first solder. The bottom surface of the thermoelectric cooler is first soldered to the heatsink using a second solder and then the top surface is soldered to the electronic device using a third solder preferably having the same composition as the second solder and hense the same melting point as the second solder, or having approximately the same melting point as the second solder. Reverse powering of the thermoelectric cooler assists the soldering of the top surface to the electronic device by heating the top surface to a temperature sufficient to melt the third solder while cooling the bottom surface of the thermoelectric cooler to a temperature lower than the melting point of the second solder. Since the second solder has a melting point chosen to be lower than the melting point of the first solder used to assemble the cooler and the third solder has the same, or nearly the same, melting point as the second solder, rather than a significantly lower melting point, the assembled electronic device may be operated at a higher temperature and tested with a higher thermal cycle.

Figure 1:
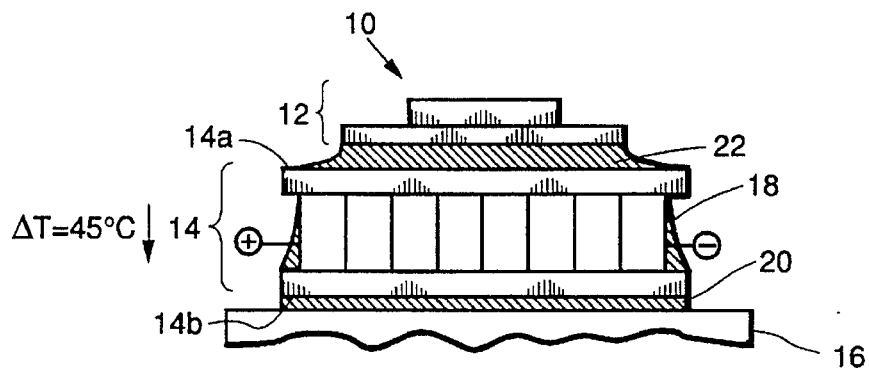
FIG. 1 shows an assembled electronic device, thermoelectric cooler, and heatsink under normal working conditions.
Figure 2:
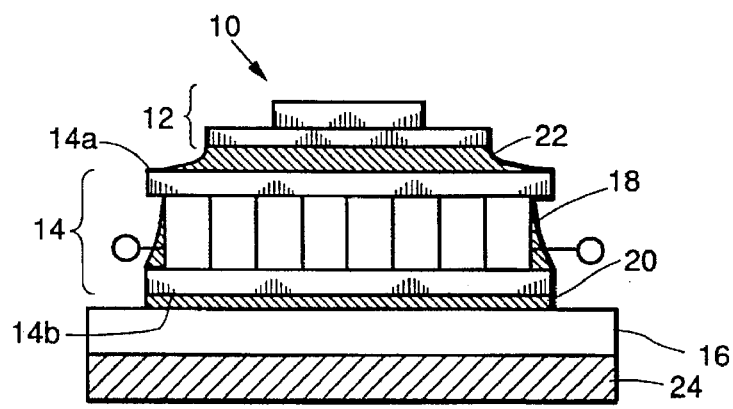
FIG. 2 shows the assembly of FIG. 1 and the use of a third solder having a significantly different melting point than the second solder to solder the top surface of the thermoelectric cooler to the electronic device, employing the prior art method.
Figure 3:
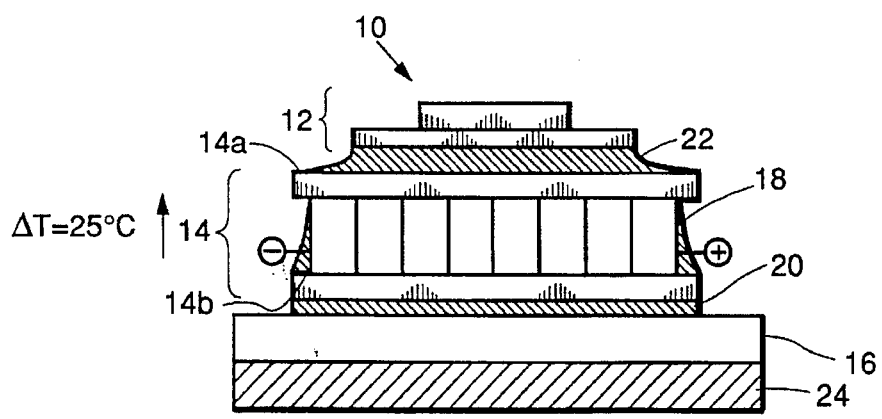
FIG. 3 shows the assembly of FIG. 1 and the reverse powered use of the thermoelectric cooler to assist the soldering of the top surface to the electronic device using a third solder having substantially the same melting point as the second solder in accordance with the present invention.

The invention is further illustrated in FIGS. 1–3. FIG. 1 shows an assembly 10 comprising electronic device 12, thermoelectric cooler 14, and heatsink 16 under normal working conditions. The details of the assembly of the thermoelectric cooler 14 are not shown, as these are conventional. Solder is used to assemble the cooler. For ease of illustration, solder fillets be, comprising a first solder composition, are shown at the periphery of the cooler 14. The thermoelectric cooler 14 is soldered to the heatsink 16 with a second solder 20. The electronic device 12 is soldered to the thermoelectric cooler 14 with a third solder 22.

During normal operating conditions, as shown in FIG. 1, the thermoelectric cooler 14 is biased so as to cause heat to flow from the electronic device 12 to the heatsink 16. Under these conditions, the electronic device 12 is at –5° C., while the heatsink 14 is at 40° C., to provide a ΔT of 45° C.

FIG. 2 shows the formation of the assembly 10 of FIG. 1 and the use of the third solder 22 having a significantly different melting point (93° C.) than the second solder 20 (117° C.) to solder the top surface 14a of the thermoelectric cooler 14 to the electronic device 12, employing prior art methods. Specifically, a heat source 24, operating at 100° C., is used to heat the third solder 22; the electronic device is at about 96° C. In the prior art approach, the thermoelectric cooler 14 is not powered during the soldering operations.

FIG. 3 shows the assembly 10 of FIG. 1 and the reverse powered use of the thermoelectric cooler 14 of the present invention to assist the soldering of the top surface 14a to the electronic device 12 using the third solder 22 having substantially the same melting point as the second solder 20, by heating the top surface 14a to a temperature of 125° C. while cooling the bottom surface 14b to 100° C. to prevent the second solder 20 from melting and detaching the thermoelectric cooler 14 from the heatsink 16. Specifically, the heating source 24 is maintained at 100° C., while the thermoelectric cooler 14 is run in reverse at a ΔT of 25° C. to heat the third solder 22; the electronic device 12 is at about 125° C.

While the foregoing description has been given in terms of a specific set of solders and soldering temperatures, it will be readily apparent to those skilled in this art that other combinations of solders and soldering temperatures may be employed in the practice of the present invention, so long as the relationships disclosed between the soldering temperatures are maintained.

EXAMPLE

A thermoelectric cooler assisted reflow soldering experiment was conducted as follows:

A hot plate was used comprising a 2 inch (5.08 centimeter) by 2 inch (5.08 centimeter) by 0.5 inch (1.27 centimeter) block of aluminum with two parallel 0.25 inch (0.635 centimeter) diameter by 2 inch (5.08 centimeter) holes. In each hole was a 115 volt/50 watt heater. These heaters can be connected to the line in series or in parallel, resulting in a heating power of 25 watts or 100 watts. The aluminum block was mounted on four ceramic insulators fastened to the floor of an aluminum box 8 inch (20.32 centimeter) by 5 inch (12.7 centimeter) by 2 inch (5.08 centimeter). The lid of the box had a glass window 2.5 inch (6.35 centimeter) by 2.5 inch (6.35 centimeter) by 0.4 inch (1.016 centimeter) to allow for observation of what happened inside. Fastened to the bottom of the aluminum block was a platinum resistor connected to the input side of an Omega 9000 temperature controller. The output of the controller was connected to the heaters through a solid state relay.

The first operation consisted in soldering a thermoelectric cooler to a 1.5 inch (3.81 centimeter) by 1.5 inch (3.81 centimeter) by 0.1 inch (0.254 centimeter) copper baseplate, using 117° C. solder and a citric acid-based aqueous flux. The hot plate was brought to 125° C. and the solder melted, wetting the baseplate as well as the cooler. The hot plate was cooled down to less than 100° C., and the stack removed. The flux was then rinsed off the cooler/hot plate stack with deionized water, then the stack was rinsed with isopropyl alcohol and dried in a vacuum oven at 55° C.

Another set of connections had been mounted through the side of the box, allowing for the connection of the thermoelectric cooler. The cooler stack was mounted again onto the hot plate. A charge-coupled device (CCD) chip, previously soldered to a gold-plated alumina substrate 0.4 inch (1.524 centimeter) by 0.4 inch (1.524 centimeter) by 0.020 inch (0.051 centimeter) with Au—Sn eutectic solder, was laid on top of the cooler stack with a few strips of flattened 117° C. solder and a citric acid-based aqueous flux in the interface. Additionally, a small iron-constantan thermocouple was pressed into contact with the top surface of the alumina substrate holding the CCD chip.

The temperature of the hot plate was brought to 100° C. The thermoelectric cooler had been connected to a LAMBDA power supply with a maximum rating of 10 volts and 3 amps, and a digital readout. With the power supply operating in the current mode, a DC current was applied to the cooler in the reverse direction (the red wire connected to the negative terminal of the power supply, the black wire connected to the positive terminal of the power supply). The current was gradually increased and when it reached 0.15 amp, melting of the solder was observed. To ensure a good wetting of the solder, the current was further increased to 0.20 amp and kept there for about 10 seconds. At that point, the temperature indicated by the thermocouple reached 126° C. The hot plate was maintained at 100° C., but the percent output of the controller increased, indicating that heat was sunk from the plate. After the 10 seconds at 0.20 amp, the current through the cooler was shut off, and the solder joint solidified immediately. Power was cut off from the hot plate and after some cooling, the leads to the cooler were disconnected, the stack removed and the flux rinsed off with deionized water, as in the first step.

Later, the cooler on its baseplate was mounted onto a large heatsink and a small thermocouple (0.005 inch (0.013 centimeter) diameter wire) glued to the alumina substrate next to the CCD chip. DC current (in the right polarity) was fed to the thermoelectric cooler ON and OFF to cycle the temperature of the CCD chip and its substrate. The results indicated that the solder joints held well.

Thus, there has been disclosed an improved method for soldering a thermoelectric cooler between an electronic device and a heatsink. It will be readily apparent to those of ordinary skill in this art that various changes and modifications of an obvious nature may be made, and all such changes and modifications are considered to fall within the scope of the invention, as defined by the appended claims.

What is claimed is:

1. A method for soldering a thermoelectric cooler between an electronic device and a heatsink, said cooler having a top surface and a bottom surface and comprising parts soldered together by a first solder having a first melting point, said method comprising:
   (a) selecting a second solder having a second melting point chosen to be lower than said first melting point of said first solder;
   (b) soldering said bottom surface of said thermoelectric cooler to said heatsink using said second solder;
   (c) soldering said top surface of said thermoelectric cooler to said electronic device using a third solder having a third melting point approximately the same as said second solder; and
   (d) powering said thermoelectric cooler in reverse during said soldering of step (c) to thereby heat said top surface of said thermoelectric cooler to a temperature sufficient to melt said third solder and solder said top surface of said thermoelectric cooler to said electronic device while simultaneously cooling said bottom surface of said thermoelectric cooler to a temperature lower than the melting point of said second solder to thereby preserve said soldering of said bottom surface of said thermoelectric cooler to said heatsink.

2. The method of claim 1 wherein said first solder has a melting point of about 138° C., and said second solder has a melting point of about 117° C.

3. The method of claim 2 wherein said thermoelectric cooler heats said top surface to a temperature of about 125° C. while cooling said bottom surface to a temperature less than or equal to 100° C.

4. The method of claim 1 wherein said third solder has the same melting point as said second solder.

5. The method of claim 4 wherein said first solder has a melting point of about 138° C., and said second solder has a melting point of about 117° C.

6. The method of claim 5 wherein said thermoelectric cooler heats said top surface to a temperature of about 125° C. while cooling said bottom surface to a temperature less than or equal to 100° C.

7. A method for soldering a thermoelectric cooler between an electronic device and a heatsink said cooler comprising parts soldered together by a first solder having a first melting point of about 138° C., said method comprising:
   (a) selecting a second solder having a second melting point of about 117° C.;
   (b) soldering the bottom surface of said thermoelectric cooler to said heatsink using said second solder;
   (c) soldering the top surface of said thermoelectric cooler to said electronic device using a third solder having a third melting point of about 117° C.; and
   (d) powering said thermoelectric cooler in reverse during said soldering of step (c) to assist the soldering of said top surface of said thermoelectric cooler to said electronic device by heating said top surface of said thermoelectric cooler to a temperature sufficient to melt said third solder while cooling said bottom surface of said thermoelectric cooler to a temperature lower than the melting point of said second solder.

8. The method of claim 7 wherein said thermoelectric cooler heats said top surface to a temperature of about 125° C. while cooling said bottom surface to a temperature less than or equal to 100° C.

9. The method of claim 7 wherein said third solder has the same composition as said second solder.

* * * * *